US009106989B2

(12) United States Patent
Li et al.

(10) Patent No.: US 9,106,989 B2
(45) Date of Patent: Aug. 11, 2015

(54) ADAPTIVE-NOISE CANCELING (ANC) EFFECTIVENESS ESTIMATION AND CORRECTION IN A PERSONAL AUDIO DEVICE

(71) Applicant: Cirrus Logic, Inc., Austin, TX (US)

(72) Inventors: Ning Li, Cedar Park, TX (US); Antonio John Miller, Austin, TX (US); Jon D. Hendrix, Wimberly, TX (US); Jie Su, Austin, TX (US); Jeffrey Alderson, Austin, TX (US); Ali Abdollahzadeh Milani, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 157 days.

(21) Appl. No.: 14/029,159

(22) Filed: Sep. 17, 2013

(65) Prior Publication Data

US 2014/0270223 A1 Sep. 18, 2014

Related U.S. Application Data

(60) Provisional application No. 61/779,266, filed on Mar. 13, 2013.

(51) Int. Cl.

*H03B 29/00* (2006.01)
*H04R 3/00* (2006.01)
*G10K 11/178* (2006.01)

(52) U.S. Cl.

CPC .............. *H04R 3/002* (2013.01); *G10K 11/178* (2013.01); *G10K 2210/1081* (2013.01); *G10K 2210/3016* (2013.01); *G10K 2210/3026* (2013.01); *G10K 2210/3028* (2013.01)

(58) Field of Classification Search

USPC ............................ 381/71.1–71.4, 71.6–71.12
See application file for complete search history.

(56) References Cited

U.S. PATENT DOCUMENTS 5,251,263 A 10/1993 Andrea et al.
5,278,913 A 1/1994 Delfosse et al.

(Continued)

FOREIGN PATENT DOCUMENTS

DE 102011013343 A1 9/2012
EP 1880699 A2 1/2008

(Continued)

OTHER PUBLICATIONS

U.S. Appl. No. 14/062,951, filed Oct. 25, 2013, Zhou et al.

(Continued)

*Primary Examiner* — Md S Elahee
(74) *Attorney, Agent, or Firm* — Mitch Harris, Atty at Law, LLC; Andrew M. Harris

(57) ABSTRACT

Techniques for estimating adaptive noise canceling (ANC) performance in a personal audio device, such as a wireless telephone, provide robustness of operation by triggering corrective action when ANC performance is low, and/or by saving a state of the ANC system when ANC performance is high. An anti-noise signal is generated from a reference microphone signal and is provided to an output transducer along with program audio. A measure of ANC gain is determined by computing a ratio of a first indication of magnitude of an error microphone signal that provides a measure of the ambient sounds and program audio heard by the listener including the effects of the anti-noise, to a second indication of magnitude of the error microphone signal without the effects of the anti-noise. The ratio can be determined for different frequency bands in order to determine whether particular adaptive filters are trained properly.

30 Claims, 10 Drawing Sheets

(56) References Cited

U.S. PATENT DOCUMENTS

| | | | |
|---|---|---|---|
| 5,337,365 | A | 8/1994 | Hamabe et al. |
| 5,410,605 | A | 4/1995 | Sawada et al. |
| 5,425,105 | A | 6/1995 | Lo et al. |
| 5,586,190 | A | 12/1996 | Trantow et al. |
| 5,640,450 | A | 6/1997 | Watanabe |
| 5,699,437 | A | 12/1997 | Finn |
| 5,706,344 | A | 1/1998 | Finn |
| 5,768,124 | A | 6/1998 | Stothers et al. |
| 5,815,582 | A | 9/1998 | Claybaugh et al. |
| 5,946,391 | A | 8/1999 | Dragwidge et al. |
| 5,991,418 | A | 11/1999 | Kuo |
| 6,041,126 | A | 3/2000 | Terai et al. |
| 6,118,878 | A | 9/2000 | Jones |
| 6,219,427 | B1 | 4/2001 | Kates et al. |
| 6,418,228 | B1 | 7/2002 | Terai et al. |
| 6,434,246 | B1 | 8/2002 | Kates et al. |
| 6,434,247 | B1 | 8/2002 | Kates et al. |
| 6,768,795 | B2 | 7/2004 | Feltstrom et al. |
| 6,850,617 | B1 | 2/2005 | Weigand |
| 7,058,463 | B1 | 6/2006 | Ruha et al. |
| 7,103,188 | B1 | 9/2006 | Jones |
| 7,181,030 | B2 | 2/2007 | Rasmussen et al. |
| 7,330,739 | B2 | 2/2008 | Somayajula |
| 7,365,669 | B1 | 4/2008 | Melanson |
| 7,742,790 | B2 | 6/2010 | Konchitsky et al. |
| 8,019,050 | B2 | 9/2011 | Mactavish et al. |
| 8,249,262 | B2 | 8/2012 | Chua et al. |
| 8,290,537 | B2 | 10/2012 | Lee et al. |
| 8,379,884 | B2 | 2/2013 | Horibe et al. |
| 8,401,200 | B2 | 3/2013 | Tiscareno et al. |
| 2001/0053228 | A1 | 12/2001 | Jones |
| 2002/0003887 | A1 | 1/2002 | Zhang et al. |
| 2004/0165736 | A1 | 8/2004 | Hetherington et al. |
| 2004/0167777 | A1 | 8/2004 | Hetherington et al. |
| 2004/0264706 | A1 | 12/2004 | Ray et al. |
| 2005/0117754 | A1 | 6/2005 | Sakawaki |
| 2005/0240401 | A1 | 10/2005 | Ebenezer |
| 2006/0153400 | A1 | 7/2006 | Fujita et al. |
| 2007/0030989 | A1 | 2/2007 | Kates |
| 2007/0033029 | A1 | 2/2007 | Sakawaki |
| 2007/0038441 | A1 | 2/2007 | Inoue et al. |
| 2007/0053524 | A1 | 3/2007 | Haulick et al. |
| 2007/0076896 | A1 | 4/2007 | Hosaka et al. |
| 2007/0154031 | A1 | 7/2007 | Avendano et al. |
| 2007/0258597 | A1 | 11/2007 | Rasmussen et al. |
| 2007/0297620 | A1 | 12/2007 | Choy |
| 2008/0019548 | A1 | 1/2008 | Avendano |
| 2008/0181422 | A1 | 7/2008 | Christoph |
| 2008/0226098 | A1 | 9/2008 | Haulick et al. |
| 2009/0012783 | A1 | 1/2009 | Klein |
| 2009/0034748 | A1 | 2/2009 | Sibbald |
| 2009/0041260 | A1 | 2/2009 | Jorgensen et al. |
| 2009/0046867 | A1 | 2/2009 | Clemow |
| 2009/0196429 | A1 | 8/2009 | Ramakrishnan et al. |
| 2009/0220107 | A1 | 9/2009 | Every et al. |
| 2009/0238369 | A1 | 9/2009 | Ramakrishnan et al. |
| 2009/0245529 | A1 | 10/2009 | Asada et al. |
| 2009/0254340 | A1 | 10/2009 | Sun et al. |
| 2009/0290718 | A1 | 11/2009 | Kahn et al. |
| 2009/0296965 | A1 | 12/2009 | Kojima |
| 2009/0304200 | A1 | 12/2009 | Kim et al. |
| 2010/0014683 | A1 | 1/2010 | Maeda et al. |
| 2010/0014685 | A1 | 1/2010 | Wurm |
| 2010/0061564 | A1 | 3/2010 | Clemow et al. |
| 2010/0069114 | A1 | 3/2010 | Lee et al. |
| 2010/0082339 | A1 | 4/2010 | Konchitsky et al. |
| 2010/0098263 | A1 | 4/2010 | Pan et al. |
| 2010/0124336 | A1 | 5/2010 | Shridhar et al. |
| 2010/0166203 | A1 | 7/2010 | Peissig et al. |
| 2010/0195838 | A1 | 8/2010 | Bright |
| 2010/0195844 | A1 | 8/2010 | Christoph et al. |
| 2010/0272276 | A1 | 10/2010 | Carreras et al. |
| 2010/0272283 | A1 | 10/2010 | Carreras et al. |
| 2010/0274564 | A1 | 10/2010 | Bakalos et al. |
| 2010/0296666 | A1 | 11/2010 | Lin |
| 2010/0296668 | A1 | 11/2010 | Lee et al. |
| 2010/0310086 | A1 | 12/2010 | Magrath et al. |
| 2010/0322430 | A1 | 12/2010 | Isberg |
| 2011/0007907 | A1 | 1/2011 | Park et al. |
| 2011/0106533 | A1 | 5/2011 | Yu |
| 2011/0142247 | A1 | 6/2011 | Fellers et al. |
| 2011/0144984 | A1 | 6/2011 | Konchitsky |
| 2011/0158419 | A1 | 6/2011 | Theverapperuma et al. |
| 2011/0222698 | A1 | 9/2011 | Asao et al. |
| 2011/0249826 | A1 | 10/2011 | Van Leest |
| 2011/0288860 | A1 | 11/2011 | Schevciw et al. |
| 2011/0293103 | A1 | 12/2011 | Park et al. |
| 2011/0299695 | A1 | 12/2011 | Nicholson |
| 2011/0317848 | A1 | 12/2011 | Ivanov et al. |
| 2012/0135787 | A1 | 5/2012 | Kusunoki et al. |
| 2012/0140943 | A1 | 6/2012 | Hendrix et al. |
| 2012/0170766 | A1 | 7/2012 | Alves et al. |
| 2012/0207317 | A1 | 8/2012 | Abdollahzadeh Milani et al. |
| 2012/0250873 | A1 | 10/2012 | Bakalos et al. |
| 2012/0259626 | A1 | 10/2012 | Li et al. |
| 2012/0300958 | A1 | 11/2012 | Klemmensen |
| 2012/0308021 | A1 | 12/2012 | Kwatra et al. |
| 2012/0308024 | A1 | 12/2012 | Alderson et al. |
| 2012/0308025 | A1 | 12/2012 | Hendrix et al. |
| 2012/0308026 | A1 | 12/2012 | Kamath et al. |
| 2012/0308027 | A1 | 12/2012 | Kwatra |
| 2012/0308028 | A1 | 12/2012 | Kwatra et al. |
| 2012/0310640 | A1 | 12/2012 | Kwatra et al. |
| 2013/0010982 | A1 | 1/2013 | Elko et al. |
| 2013/0243225 | A1 | 9/2013 | Yokota |
| 2013/0272539 | A1 | 10/2013 | Kim et al. |
| 2013/0287218 | A1 | 10/2013 | Alderson et al. |
| 2013/0287219 | A1 | 10/2013 | Hendrix et al. |
| 2013/0301842 | A1 | 11/2013 | Hendrix et al. |
| 2013/0301846 | A1 | 11/2013 | Alderson et al. |
| 2013/0301847 | A1 | 11/2013 | Alderson et al. |
| 2013/0301848 | A1 | 11/2013 | Zhou et al. |
| 2013/0301849 | A1 | 11/2013 | Alderson et al. |
| 2013/0343556 | A1 | 12/2013 | Bright |
| 2013/0343571 | A1 | 12/2013 | Rayala et al. |
| 2014/0044275 | A1 | 2/2014 | Goldstein et al. |
| 2014/0050332 | A1 | 2/2014 | Nielsen et al. |
| 2014/0086425 | A1 | 3/2014 | Jensen et al. |
| 2014/0177851 | A1 | 6/2014 | Kitazawa et al. |
| 2014/0211953 | A1 | 7/2014 | Alderson et al. |
| 2014/0270222 | A1 | 9/2014 | Hendrix et al. |
| 2014/0270224 | A1 | 9/2014 | Zhou et al. |

FOREIGN PATENT DOCUMENTS

| | | | |
|---|---|---|---|
| EP | 1947642 | A1 | 7/2008 |
| EP | 2133866 | A1 | 12/2009 |
| EP | 2216774 | A1 | 8/2010 |
| EP | 2395500 | A1 | 12/2011 |
| EP | 2395501 | A1 | 12/2011 |
| GB | 2401744 | A | 11/2004 |
| GB | 2455821 | A | 6/2009 |
| GB | 2455824 | A | 6/2009 |
| GB | 2455828 | A | 6/2009 |
| GB | 2484722 | A | 4/2012 |
| JP | H06-186985 | A | 7/1994 |
| WO | WO 03/015074 | A1 | 2/2003 |
| WO | WO 2004009007 | A1 | 1/2004 |
| WO | WO 2007007916 | A1 | 1/2007 |
| WO | WO 2007113487 | A1 | 11/2007 |
| WO | WO 2010117714 | A1 | 10/2010 |
| WO | WO 2012134874 | A1 | 10/2012 |

OTHER PUBLICATIONS

Campbell, Mikey, "Apple looking into self-adjusting earbud headphones with noise cancellation tech", Apple Insider, Jul. 4, 2013, pp. 1-10 (10 pages in pdf), downloaded on May 14, 2014 from http://appleinsider.com/articles/13/07/04/apple-looking-into-self-adjusting-earbud-headphones-with-noise-cancellation-tech.

Jin, et al. "A simultaneous equation method-based online secondary path modeling algorithm for active noise control", Journal of Sound and Vibration, Apr. 25, 2007, pp. 455-474, vol. 303, No. 3-5, London, GB.

(56) References Cited

OTHER PUBLICATIONS

Erkelens, et al., "Tracking of Nonstationary Noise Based on Data-Driven Recursive Noise Power Estimation", IEEE Transactions on Audio Speech and Language Processing, Aug. 2008, pp. 1112-1123, vol. 16, No. 6, Piscataway, NJ, US.
Rao, et al., "A Novel Two State Single Channel Speech Enhancement Technique", India Conference (INDICON) 2011 Annual IEEE, IEEE, Dec. 2011, 6 pages (pp. 1-6 in pdf), Piscataway, NJ, US.
Rangachari, et al., "A noise-estimation algorithm for highly non-stationary environments", Speech Communication, Feb. 2006, pp. 220-231, vol. 48, No. 2. Elsevier Science Publishers.
U.S. Appl. No. 14/197,814, filed Mar. 5, 2014, Kaller et al.
U.S. Appl. No. 14/210,537, filed Mar. 14, 2014, Abdollahzadeh Milani et al.
U.S. Appl. No. 14/210,589, filed Mar. 14, 2014, Abdollahzadeh Milani et al.
Black, John W., "An Application of Side-Tone in Subjective Tests of Microphones and Headsets", Project Report No. NM 001 064.01.20, Research Report of the U.S. Naval School of Aviation Medicine, Feb. 1, 1954, 12 pages (pp. 1-12 in pdf), Pensacola, FL, US.
Peters, Robert W., "The Effect of High-Pass and Low-Pass Filtering of Side-Tone Upon Speaker Intelligibility", Project Report No. NM 001 064.01.25, Research Report of the U.S. Naval School of Aviation Medicine, Aug. 16, 1954, 13 pages (pp. 1-13 in pdf), Pensacola, FL, US.
Lane, et al., "Voice Level: Autophonic Scale, Perceived Loudness, and the Effects of Sidetone", The Journal of the Acoustical Society of America, Feb. 1961, pp. 160-167, vol. 33, No. 2., Cambridge, MA, US.
Liu, et al., "Compensatory Responses to Loudness-shifted Voice Feedback During Production of Mandarin Speech", Journal of the Acoustical Society of America, Oct. 2007, pp. 2405-2412, vol. 122, No. 4.
Paepcke, et al., "Yelling in the Hall: Using Sidetone to Address a Problem with Mobile Remote Presence Systems", Symposium on User Interface Software and Technology, Oct. 16-19, 2011, 10 pages (pp. 1-10 in pdf), Santa Barbara, CA, US.
Therrien, et al., "Sensory Attenuation of Self-Produced Feedback: The Lombard Effect Revisited", PLOS ONE, Nov. 2012, pp. 1-7, vol. 7, Issue 11, e49370, Ontario, Canada.
U.S. Appl. No. 13/686,353, filed Nov. 27, 2012, Hendrix et al.
U.S. Appl. No. 13/795,160, filed Mar. 12, 2013, Hendrix et al.
U.S. Appl. No. 13/692,367, filed Dec. 3, 2012, Alderson et al.
U.S. Appl. No. 13/722,119, filed Dec. 20, 2012, Hendrix et al.
U.S. Appl. No. 13/727,718, filed Dec. 27, 2012, Alderson et al.
U.S. Appl. No. 13/729,141, filed Dec. 28, 2012, Zhou et al.
U.S. Appl. No. 13/784,018, filed Mar. 4, 2013, Alderson et al.
U.S. Appl. No. 13/787,906, filed Mar. 7, 2013, Alderson et al.
U.S. Appl. No. 13/794,931, filed Mar. 12, 2013, Lu et al.
U.S. Appl. No. 13/794,979, filed Mar. 12, 2013, Alderson et al.
Pfann, et al., "LMS Adaptive Filtering with Delta-Sigma Modulated Input Signals," IEEE Signal Processing Letters, Apr. 1998, pp. 95-97, vol. 5, No. 4, IEEE Press, Piscataway, NJ.
Toochinda, et al. "A Single-Input Two-Output Feedback Formulation for ANC Problems," Proceedings of the 2001 American Control Conference, Jun. 2001, pp. 923-928, vol. 2, Arlington, VA.
Kuo, et al., "Active Noise Control: A Tutorial Review," Proceedings of the IEEE, Jun. 1999, pp. 943-973, vol. 87, No. 6, IEEE Press, Piscataway, NJ.
Johns, et al., "Continuous-Time LMS Adaptive Recursive Filters," IEEE Transactions on Circuits and Systems, Jul. 1991, pp. 769-778, vol. 38, No. 7, IEEE Press, Piscataway, NJ.
Shoval, et al., "Comparison of DC Offset Effects in Four LMS Adaptive Algorithms," IEEE Transactions on Circuits and Systems II: Analog and Digital Processing, Mar. 1995, pp. 176-185, vol. 42, Issue 3, IEEE Press, Piscataway, NJ.
Mali, Dilip, "Comparison of DC Offset Effects on LMS Algorithm and its Derivatives," International Journal of Recent Trends in Engineering, May 2009, pp. 323-328, vol. 1, No. 1, Academy Publisher.
Kates, James M., "Principles of Digital Dynamic Range Compression," Trends in Amplification, Spring 2005, pp. 45-76, vol. 9, No. 2, Sage Publications.
Gao, et al., "Adaptive Linearization of a Loudspeaker," IEEE International Conference on Acoustics, Speech, and Signal Processing, Apr. 14-17, 1991, pp. 3589-3592, Toronto, Ontario, CA.
Silva, et al., "Convex Combination of Adaptive Filters With Different Tracking Capabilities," IEEE International Conference on Acoustics, Speech, and Signal Processing, Apr. 15-20, 2007, pp. III 925-928, vol. 3, Honolulu, HI, USA.
Akhtar, et al., "A Method for Online Secondary Path Modeling in Active Noise Control Systems," IEEE International Symposium on Circuits and Systems, May 23-26, 2005, pp. 264-267, vol. 1, Kobe, Japan.
Davari, et al., "A New Online Secondary Path Modeling Method for Feedforward Active Noise Control Systems," IEEE International Conference on Industrial Technology, Apr. 21-24, 2008, pp. 1-6, Chengdu, China.
Lan, et al., "An Active Noise Control System Using Online Secondary Path Modeling With Reduced Auxiliary Noise," IEEE Signal Processing Letters, Jan. 2002, pp. 16-18, vol. 9, Issue 1, IEEE Press, Piscataway, NJ.
Liu, et al., "Analysis of Online Secondary Path Modeling With Auxiliary Noise Scaled by Residual Noise Signal," IEEE Transactions on Audio, Speech and Language Processing, Nov. 2010, pp. 1978-1993, vol. 18, Issue 8, IEEE Press, Piscataway, NJ.
Parkins, et al., "Narrowband and broadband active control in an enclosure using the acoustic energy density", J. Acoust. Soc. Am. Jul. 2000, pp. 192-203, vol. 108, issue 1, US.
Feng, et al.., "A broadband self-tuning active noise equaliser", Signal Processing, Oct. 1, 1997, pp. 251-256, vol. 62, No. 2, Elsevier Science Publishers B.V. Amsterdam, NL.
Zhang, et al., "A Robust Online Secondary Path Modeling Method with Auxiliary Noise Power Scheduling Strategy and Norm Constraint Manipulation", IEEE Transactions on Speech and Audio Processing, IEEE Service Center, Jan. 1, 2003, pp. 45-53, vol. 11, No. 1, NY.
Lopez-Gaudana, et al., "A hybrid active noise cancelling with secondary path modeling", 51st Midwest Symposium on Circuits and Systems, MWSCAS 2008, Aug. 10-13, 2008, pp. 277-280, IEEE, Knoxville, TN.
International Search Report and Written Opinion in PCT/US2014/016824, mailed on May 22, 2014, 12 pages (pp. 1-12 in pdf).
U.S. Appl. No. 14/228,322, filed Mar. 28, 2014, Alderson et al.
U.S. Appl. No. 13/762,504, filed Feb. 8, 2013, Abdollahzadeh Milani et al.
U.S. Appl. No. 13/721,832, filed Dec. 20, 2012, Lu et al.
U.S. Appl. No. 13/724,656, filed Dec. 21, 2012, Lu et al.
U.S. Appl. No. 14/252,235, filed Apr. 14, 2014, Lu et al.
U.S. Appl. No. 13/968,013, filed Aug. 15, 2013, Abdollahzadeh Milani et al.
U.S. Appl. No. 13/924,935, filed Jun. 24, 2013, Hellman et al.
U.S. Appl. No. 13/896,526, filed May. 17, 2013, Naderi et al.
U.S. Appl. No. 14/101,955, filed Dec. 10, 2013, Alderson et al.
U.S. Appl. No. 14/101,777, filed Dec. 10, 2013, Alderson et al.
Abdollahzadeh Milani, et al., "On Maximum Achievable Noise Reduction in ANC Systems",2010 IEEE International Conference on Acoustics Speech and Signal Processing, Mar. 14-19, 2010, pp. 349-352, Dallas, TX, US.
Cohen, Israel, "Noise Spectrum Estimation in Adverse Environments: Improved Minima Controlled Recursive Averaging", IEEE Transactions on Speech and Audio Processing, Sep. 2003, pp. 1-11, vol. 11, Issue 5, Piscataway, NJ, US.
Ryan, et al., "Optimum Near-Field Performance of Microphone Arrays Subject to a Far-Field Beampattern Constraint", J. Acoust. Soc. Am., Nov. 2000, pp. 2248-2255, 108 (5), Pt. 1, Ottawa, Ontario, Canada.
Cohen, et al., "Noise Estimation by Minima Controlled Recursive Averaging for Robust Speech Enhancement", IEEE Signal Processing Letters, Jan. 2002, pp. 12-15, vol. 9, No. 1, Piscataway, NJ, US.

(56) References Cited

OTHER PUBLICATIONS

Martin, Rainer, "Noise Power Spectral Density Estimation Based on Optimal Smoothing and Minimum Statistics", IEEE Transactions on Speech and Audio Processing, Jul. 2001, pp. 504-512, vol. 9, No. 5, Piscataway, NJ, US.

Martin, Rainer, "Spectral Subtraction Based on Minimum Statistics", Signal Processing VII Theories and Applications, Proceedings of EUSIPCO-94, 7th European Signal Processing Conference, Sep. 13-16, 1994, pp. 1182-1185, vol. III, Edinburgh, Scotland, U.K.

Booij, et al., "Virtual sensors for local, three dimensional, broadband multiple-channel active noise control and the effects on the quiet zones", Proceedings of the International Conference on Noise and Vibration Engineering, ISMA 2010, Sep. 20-22, 2010, pp. 151-166, Leuven.

Kuo, et al., "Residual noise shaping technique for active noise control systems", J. Acoust. Soc. Am. 95(3), Mar. 1994, pp. 1665-1668.

Lopez-Caudana, Edgar Omar, "Active Noise Cancellation: The Unwanted Signal and The Hybrid Solution", Adaptive Filtering Applications, Dr. Lino Garcia (Ed.), Jul. 2011, pp. 49-84, ISBN: 978-953-307-306-4, InTech.

Senderowicz, et al., "Low-Voltage Double-Sampled Delta-Sigma Converters", IEEE Journal on Solid-State Circuits, Dec. 1997, pp. 1907-1919, vol. 32, No. 12, Piscataway, NJ.

Hurst, et al., "An improved double sampling scheme for switched-capacitor delta-sigma modulators", 1992 IEEE Int. Symp. On Circuits and Systems, May 10-13, 1992, vol. 3, pp. 1179-1182, San Diego, CA.

ADAPTIVE-NOISE CANCELING (ANC) EFFECTIVENESS ESTIMATION AND CORRECTION IN A PERSONAL AUDIO DEVICE

This U.S. patent application claims priority under 35 U.S.C. §119(e) to U.S. Provisional Patent Application Ser. No. 61/779,266 filed on Mar. 13, 2013.

BACKGROUND OF THE INVENTION

1. Field of the Invention

The present invention relates generally to personal audio devices such as headphones that include adaptive noise cancellation (ANC), and, more specifically, to architectural features of an ANC system in which performance of the ANC system is measured and used to adjust operation.

2. Background of the Invention

Wireless telephones, such as mobile/cellular telephones, cordless telephones, and other consumer audio devices, such as MP3 players, are in widespread use. Performance of such devices with respect to intelligibility can be improved by providing adaptive noise canceling (ANC) using a reference microphone to measure ambient acoustic events and then using signal processing to insert an anti-noise signal into the output of the device to cancel the ambient acoustic events.

However, performance of the ANC system in such devices is difficult to monitor. Since the ANC system may not always be adapting, if the position of the device with respect to the user's ear changes, the ANC system may actually increase the ambient noise heard by the user.

Therefore, it would be desirable to provide a personal audio device, including a wireless telephone that implements adaptive noise cancellation and can monitor performance to improve cancellation of ambient sounds.

SUMMARY OF THE INVENTION

The above-stated objectives of providing a personal audio device having adaptive noise cancellation and can further monitor performance to improve cancellation of ambient sounds is accomplished in a personal audio system, a method of operation, and an integrated circuit.

The personal audio device includes an output transducer for reproducing an audio signal that includes both source audio for playback to a listener, and an anti-noise signal for countering the effects of ambient audio sounds in an acoustic output of the transducer. The personal audio device also includes the integrated circuit to provide adaptive noise-canceling (ANC) functionality. The method is a method of operation of the personal audio system and integrated circuit. A reference microphone is mounted on the device housing to provide a reference microphone signal indicative of the ambient audio sounds. The personal audio system further includes an ANC processing circuit for adaptively generating an anti-noise signal from the reference microphone signal using an adaptive filter, such that the anti-noise signal causes substantial cancellation of the ambient audio sounds. An error signal is generated from an error microphone located in the vicinity of the transducer, by modeling the electro-acoustic path through the transducer and error microphone with a secondary path adaptive filter. The estimated secondary path response is used to determine and remove the source audio components from the error microphone signal. The ANC processing circuit monitors ANC performance by computing a ratio of a first indication of a magnitude of the error signal including effects of the anti-noise signal to a second indication of the magnitude of the error microphone signal without the effects of the anti-noise signal. The ratio is used as an indication of ANC gain, which can be compared to a threshold or otherwise used to evaluate ANC performance and take further action.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present disclosure is directed to noise-canceling techniques and circuits that can be implemented in a personal audio system, such as a wireless telephone. The personal audio system includes an adaptive noise canceling (ANC) circuit that measures the ambient acoustic environment and generates a signal that is injected into the speaker or other transducer output to cancel ambient acoustic events. A reference microphone is provided to measure the ambient acoustic environment, which is used to generate an anti-noise signal provided to the speaker to cancel the ambient audio sounds. An error microphone measures the ambient environment at the output of the transducer to minimize the ambient sounds heard by the listener using an adaptive filter. Another secondary path adaptive filter is used to estimate the electro-acoustic path through the transducer and error microphone so that source audio can be removed from the error microphone output to generate an error signal, which is then minimized by the ANC circuit. A monitoring circuit computes a ratio of the error signal to the reference microphone output signal or other indication of the magnitude of the reference microphone signal, to provide a measure of ANC gain. The ANC gain measure is an indication of ANC performance, which is compared to a threshold or otherwise evaluated to determine whether the ANC system is operating effectively, and to take further action, if needed.

Figure 1:
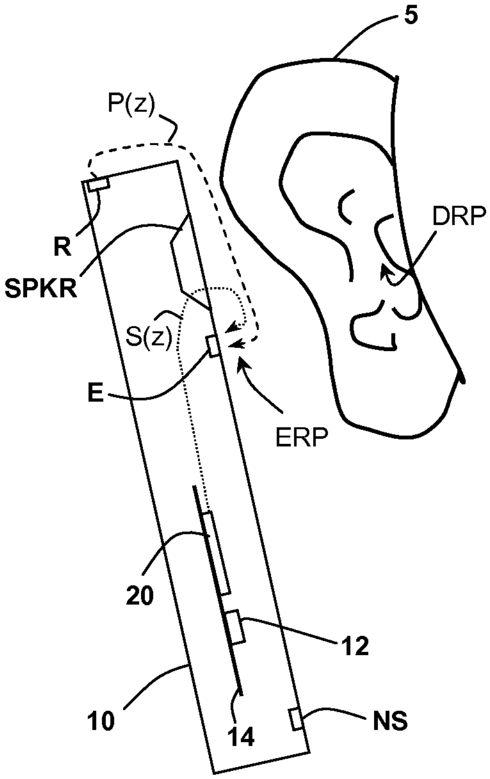
FIG. 1 is an illustration of an exemplary wireless telephone 10.

Referring now to FIG. 1, a wireless telephone 10 is illustrated in proximity to a human ear 5. Illustrated wireless telephone 10 is an example of a device in which techniques disclosed herein may be employed, but it is understood that not all of the elements or configurations embodied in illustrated wireless telephone 10, or in the circuits depicted in subsequent illustrations, are required in order to practice the Claims. Wireless telephone 10 includes a transducer such as a speaker SPKR that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from web-pages or other network communications received by wireless telephone 10 and audio indications such as battery low and other system event notifications. A near speech microphone NS is provided to capture near-end speech, which is transmitted from wireless telephone 10 to the other conversation participant(s).

Wireless telephone 10 includes adaptive noise canceling (ANC) circuits and features that inject an anti-noise signal into speaker SPKR to improve intelligibility of the distant speech and other audio reproduced by speaker SPKR. A reference microphone R is provided for measuring the ambient acoustic environment, and is positioned away from the typical position of a user's mouth, so that the near-end speech is minimized in the signal produced by reference microphone R. A third microphone, error microphone E is provided in order to further improve the ANC operation by providing a measure of the ambient audio combined with the audio reproduced by speaker SPKR close to ear 5 at an error microphone reference position ERP, when wireless telephone 10 is in close proximity to ear 5. Exemplary circuits 14 within wireless telephone 10 include an audio CODEC integrated circuit 20 that receives the signals from reference microphone R, near speech microphone NS and error microphone E and interfaces with other integrated circuits such as an RF integrated circuit 12 containing the wireless telephone transceiver. In alternative implementations, the circuits and techniques disclosed herein may be incorporated in a single integrated circuit that contains control circuits and other functionality for implementing the entirety of the personal audio device, such as an MP3 player-on-a-chip integrated circuit.

In general, the ANC techniques disclosed herein measure ambient acoustic events (as opposed to the output of speaker SPKR and/or the near-end speech) impinging on reference microphone R, and by also measuring the same ambient acoustic events impinging on error microphone E. The ANC processing circuits of illustrated wireless telephone 10 adapt an anti-noise signal generated from the output of reference microphone R to have a characteristic that minimizes the amplitude of the ambient acoustic events at error microphone E, i.e. at error microphone reference position ERP. Since acoustic path P(z) extends from reference microphone R to error microphone E, the ANC circuits are essentially estimating acoustic path P(z) combined with removing effects of an electro-acoustic path S(z). Electro-acoustic path S(z) represents the response of the audio output circuits of CODEC IC 20 and the acoustic/electric transfer function of speaker SPKR, including the coupling between speaker SPKR and error microphone E in the particular acoustic environment. The coupling between speaker SPKR and error microphone E is affected by the proximity and structure of ear 5 and other physical objects and human head structures that may be in proximity to wireless telephone 10, when wireless telephone 10 is not firmly pressed to ear 5. Since the user of wireless telephone 10 actually hears the output of speaker SPKR at a drum reference position DRP, differences between the signal produced by error microphone E and what is actually heard by the user are shaped by the response of the ear canal, as well as the spatial distance between error microphone reference position ERP and drum reference position DRP. While the illustrated wireless telephone 10 includes a two microphone ANC system with a third near speech microphone NS, some aspects of the techniques disclosed herein may be practiced in a system that does not include separate error and reference microphones, or a wireless telephone using near speech microphone NS to perform the function of the reference microphone R. Also, in personal audio devices designed only for audio playback, near speech microphone NS will generally not be included, and the near speech signal paths in the circuits described in further detail below can be omitted.

Figure 2:
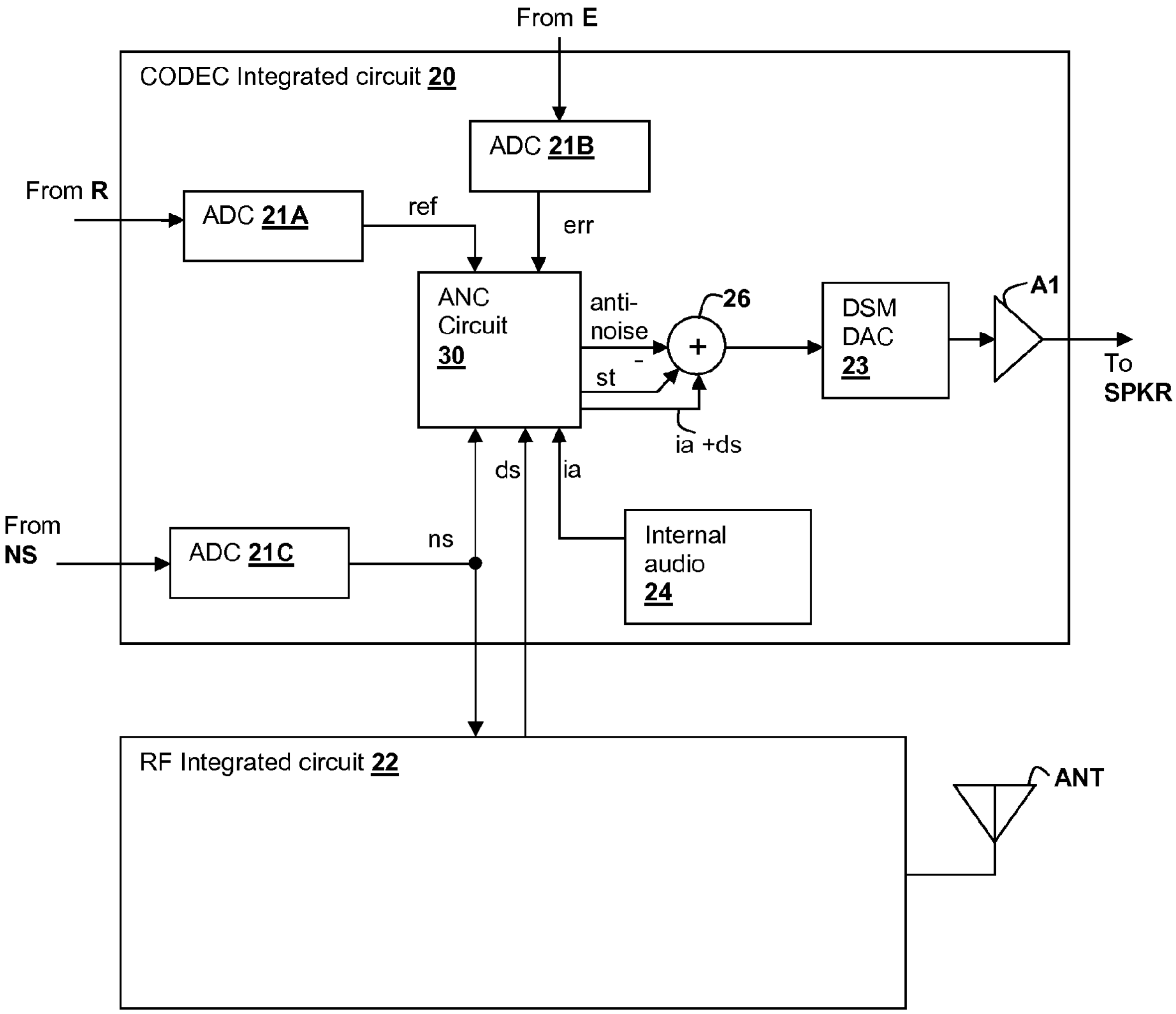
FIG. 2 is a block diagram of circuits within wireless telephone 10.

Referring now to FIG. 2, circuits within wireless telephone 10 are shown in a block diagram. The circuit shown in FIG. 2 further applies to the other configurations mentioned above, except that signaling between CODEC integrated circuit 20 and other units within wireless telephone 10 are provided by cables or wireless connections when CODEC integrated circuit 20 is located outside of wireless telephone 10. Signaling between CODEC integrated circuit 20 and error microphone E, reference microphone R and speaker SPKR are provided by wired connections when CODEC integrated circuit 20 is located within wireless telephone 10. CODEC integrated circuit 20 includes an analog-to-digital converter (ADC) 21A for receiving the reference microphone signal and generating a digital representation ref of the reference microphone signal. CODEC integrated circuit 20 also includes an ADC 21B for receiving the error microphone signal and generating a digital representation err of the error microphone signal, and an ADC 21C for receiving the near speech microphone signal and generating a digital representation ns of the near speech microphone signal. CODEC IC 20 generates an output for driving speaker SPKR from an amplifier A1, which amplifies the output of a digital-to-analog converter (DAC) 23 that receives the output of a combiner 26. Combiner 26 combines audio signals from an internal audio source 24 and downlink audio sources, e.g., the combined audio of downlink audio ds and internal audio ia, which is source audio (ds+ia), and an anti-noise signal anti-noise generated by an ANC circuit 30. Anti-noise signal anti-noise, by convention, has the same polarity as the noise in reference microphone signal ref and is therefore subtracted by combiner 26. Combiner 26 also combines an attenuated portion of near speech signal ns, i.e., sidetone information st, so that the user of wireless telephone 10 hears their own voice in proper relation to downlink speech ds, which is received from a radio frequency (RF) integrated circuit 22. Near speech signal ns is also provided to RF integrated circuit 22 and is transmitted as uplink speech to the service provider via an antenna ANT.

Figure 3A:
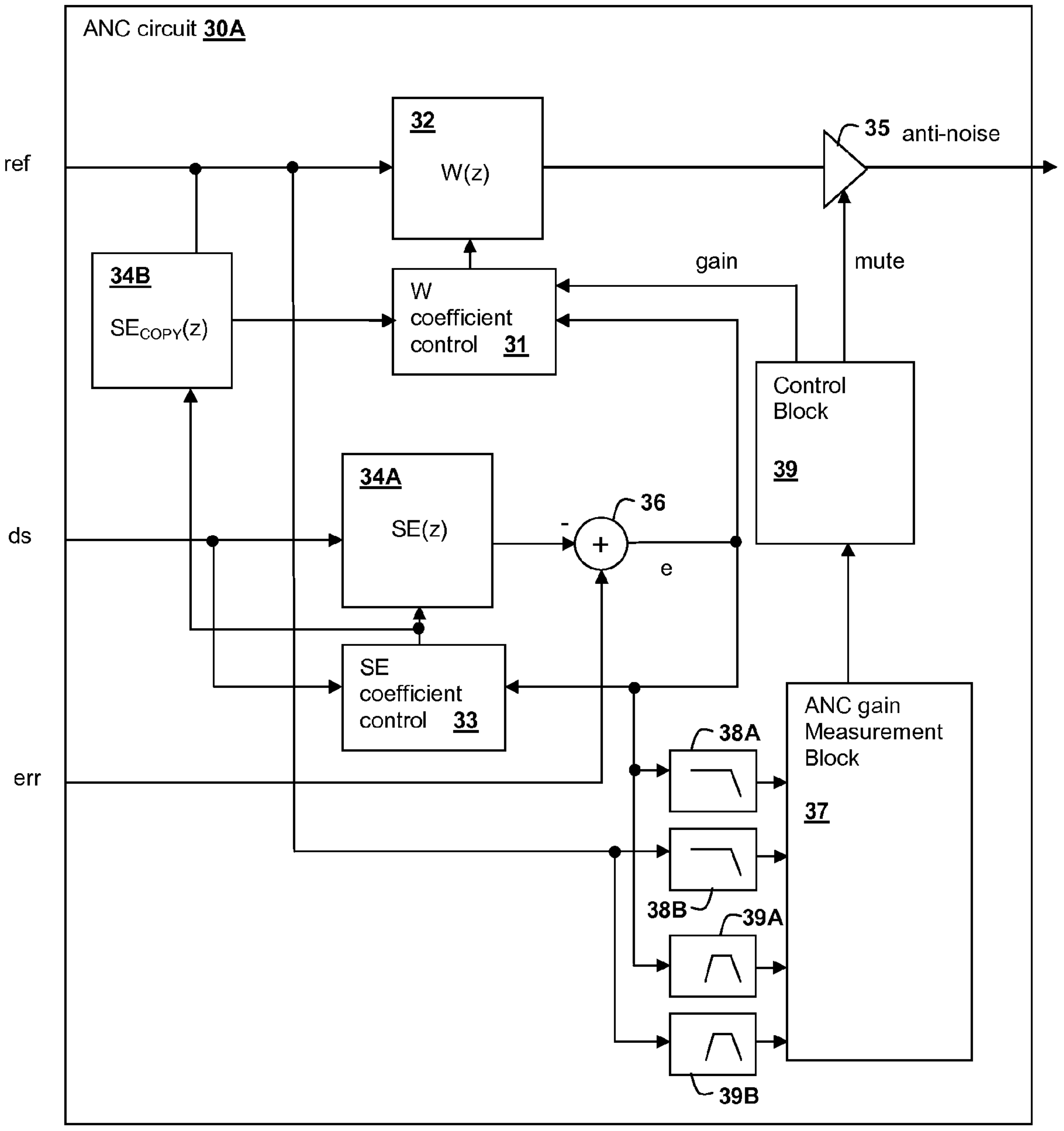
FIGS. 3A-3B are block diagrams depicting signal processing circuits and functional blocks of various exemplary ANC circuits that can be used to implement ANC circuit 30 of CODEC integrated circuit 20 of FIG. 2.

Referring now to FIG. 3A, details of an ANC circuit 30A that can be used to implement ANC circuit 30 of FIG. 2 are shown. An adaptive filter 32 receives reference microphone signal ref and under ideal circumstances, adapts its transfer function W(z) to be P(z)/S(z) to generate the anti-noise signal. The coefficients of adaptive filter 32 are controlled by a W coefficient control block 31 that uses a correlation of two signals to determine the response of adaptive filter 32, which generally minimizes, in a least-mean squares sense, those components of reference microphone signal ref that are present in error microphone signal err. The signals provided as inputs to W coefficient control block 31 are the reference microphone signal ref as shaped by a copy of an estimate of the response of path S(z) provided by a filter 34B and another signal provided from the output of a combiner 36 that includes error microphone signal err and an inverted amount of downlink audio signal ds that has been processed by filter response SE(z), of which response $SE_{COPY}(z)$ is a copy. By transforming the inverted copy of downlink audio signal ds with the estimate of the response of path S(z), the downlink audio that is removed from error microphone signal err before comparison should match the expected version of downlink audio signal ds reproduced at error microphone signal err, since the electrical and acoustical path S(z) is the path taken by downlink audio signal ds to arrive at error microphone E. Combiner 36 combines error microphone signal err and the inverted downlink audio signal ds to produce an error signal e. By transforming reference microphone signal ref with a copy of the estimate of the response of path S(z), $SE_{COPY}(z)$, and minimizing the portion of the error signal that correlates with components of reference microphone signal ref, adaptive filter 32 adapts to the desired response of P(z)/S(z). By removing downlink audio signal ds from error signal e, adaptive filter 32 is prevented from adapting to the relatively large amount of downlink audio present in error microphone signal err.

To implement the above, an adaptive filter 34A has coefficients controlled by a SE coefficient control block 33, which updates based on correlated components of downlink audio signal ds and an error value. SE coefficient control block 33 correlates the actual downlink speech signal ds with the components of downlink audio signal ds that are present in error microphone signal err. Adaptive filter 34A is thereby adapted to generate a signal from downlink audio signal ds, that when subtracted from error microphone signal err, contains the content of error microphone signal err that is not due to downlink audio signal ds in error signal e.

In ANC circuit 30A, there are several oversight controls that sequence the operations of ANC circuit 30A. As such, not all portions of ANC circuit 30A operate continuously. For example, SE coefficient control block 33 can generally only update the coefficients provided to secondary path adaptive filter 34A when source audio d is present, or some other form of training signal is available. W coefficient control block 31 can generally only update the coefficients provided to adaptive filter 32 when response SE(z) is properly trained. Since movement of wireless telephone 10 on ear 5 can change response SE(z) by 20 dB or more, changes in ear position can have dramatic effects on ANC operation. For example, if wireless telephone 10 is pressed harder to ear 5, then the anti-noise signal may be too high in amplitude and produce noise boost before response SE(z) can be updated, which will not occur until downlink audio is present. Since response W(z) will not be properly trained until after SE(z) is updated, the problem can persist. Therefore, it would be desirable to determine whether ANC circuit 30A is operating properly, i.e., that anti-noise signal anti-noise is effectively canceling the ambient sounds.

ANC circuit 30A includes a pair of low-pass filters 38A-38B, which filter error signal e and reference microphone signal ref, respectively, to provide signals indicative of low-frequency components of error microphone signal err and reference microphone signal ref. ANC circuit 30A may also include a pair of band-pass (or high-pass) filters 39A-39B, which filter error signal e and reference microphone signal ref, respectively, to provide signals indicative of high-frequency components of microphone signal err and reference microphone signal ref. The pass-band of band-pass filters 39A-39B generally begins at the stop-band frequency of low-pass filters 38A-38B, but overlap may be provided. A magnitude E of error microphone signal err when the anti-noise signal is active is given by:

$$E_{ANC\_ON}=R*P(z)-R*W(z)*S(z),$$

where R is the magnitude of reference microphone signal ref. When the anti-noise signal is muted, the magnitude of error microphone signal err is:

$$E_{ANC\_OFF}=R*P(z)$$

Defining "ANC gain", G, as the ratio $E_{ANC\_ON}/E_{ANC\_OFF}$, a direct indication of the effectiveness of the ANC system can be provided. If the anti-noise signal can be muted, then a measurement of $E_{ANC\_ON}$ and $E_{ANC\_OFF}$ can be made, and G can be computed. However, during operation, muting of the anti-noise signal may not be practical, since any muting of the anti-noise signal would likely be audible to the listener. Since acoustic path response P(z) does not vary substantially with ear position or ear pressure, and can be assumed to be a constant, e.g., unity, for frequencies below approximately 800 Hz, the value of magnitudes $E_{ANC\_ON}$ and $E_{ANC\_OFF}$ may be estimated as:

$$E_{ANC\_ON}=R*1-R*W(z)*S(z) \text{ and } E_{ANC\_OFF}=R*1, \text{ thus}$$

$$G=E_{ANC\_ON}/E_{ANC\_OFF}=[R-R*W(z)*S(z)]/R=E_{ANC\_ON}/R$$

Defining "ANC gain", G, as the ratio $E_{ANC\_ON}/R$, a direct indication of the effectiveness of the ANC system can be calculated by dividing an indication of magnitude E of error microphone signal err while the ANC circuit is active by an indication of magnitude R of reference microphone signal ref. G can be computed from the outputs of low-pass filters 38A-38B to provide a measure of whether the ANC system is operating effectively.

Figure 5:
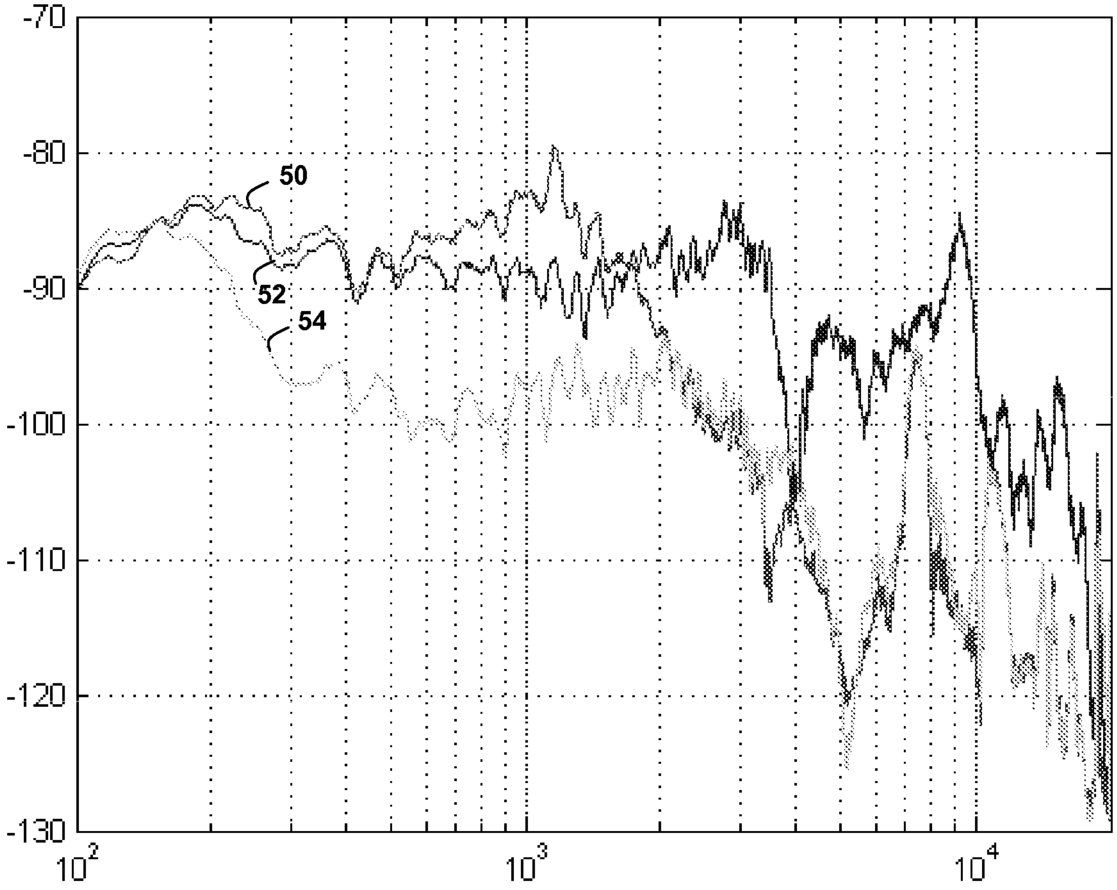
FIG. 5 is a graph of ANC gain versus frequency for various conditions of wireless telephone 10.

In contrast to acoustic path response P(z), acoustic path response S(z) changes substantially with ear pressure and position, but by determining the magnitudes (E, R) of reference microphone signal ref and error microphone signal err below a predetermined frequency, for example, 500 Hz, the value of the "ANC gain" G=E/R can be measured during a time in which acoustic path response S(z) is unchanging. A control block 39 mutes the anti-noise signal output of adaptive filter 32 by asserting a control signal mute, which controls a muting stage 35. An ANC gain measurement block 37 measures a magnitude E of error signal e, which is the error microphone signal corrected to remove source audio d present in error microphone signal err and uses the measured magnitude as indication of magnitude E. Alternatively error microphone signal err could be used to determine an indication of magnitude E when source audio d is absent or below a threshold amplitude. FIG. 5 illustrates the value of P(z)−W(z)*S(z) for conditions: an on-ear operation with ANC on (un-muted) 54, an off-ear operation 52 and an on-ear operation with an ANC off (muted) condition 50. The contribution of ANC gain G is visible in the graph as the change between curve 54 and the appropriate one of the other curves 50, 52 due to muting/un-muting the anti-noise signal, i.e., component R*W(z)*S(z) or R*G.

Since the ANC system acts to minimize magnitude E=R*P(z)−R*W(z)*S(z), if the ANC system is canceling noise effectively, then E/R will be small. If leakage correction is present, the above relationship remains unchanged since, when including leakage in the model, R is replaced in the above relationship with R+E*L(z), where L(z) is the leakage, then $$E/R=(R+E*L(z))*(P(z)-W(z)*S(z))/(R+E*L(z)),$$

which is also equal to $$P(z)-W(z)*S(z)$$

and thus can also be approximated by G=E/R. One exemplary algorithm that may be implemented by ANC circuit 30A filters error microphone signal err and reference microphone signal ref and calculates E/R from the magnitudes of the filtered signals after SE(z) and W(z) have been trained. The initial value of E/R is saved as $G_0$. The value of E/R=G is subsequently monitored and if $G-G_0$>threshold, an off-model condition is detected. The actions described below can be taken in response to detecting the off-model condition. In another algorithm, the frequency range differences described above with respect to FIGS. 5-6 can be used to advantage. Since below approximately 600 Hz path P(z) is unchanging, but above 600 Hz path P(z) changes, if changes occur only above 600 Hz, then the changes can be assumed to be due to changes in path P(z), but if changes occur both below and above 600 Hz, then S(z) has changed. A frequency of 600 Hz is only exemplary, and for other systems and implementations, a suitable cut-off frequency for decision-making may be selected to distinguish between changes in path P(z) vs. changes in S(z). Specific algorithms are discussed below. An advantage of the above algorithm is that determining when path P(z) only has changed permits control of adaptation such that only response W(z) is updated, since response SE(z) is known to be a good model under such conditions. Chaotic conditions can also be determined rapidly, such as those caused by wind/scratch noise. The rate of updating is also very fast, since the ANC gain can be computed at each time frame of measuring err and ref amplitudes.

Another algorithm that can provide additional information about whether response SE(z) is correctly modeling acoustic path S(z) and whether response W(z) is also properly adapted, uses the frequency-dependent behavior of Path P(z) to advantage. A first ratio is computed from magnitudes of the low-pass filtered versions of error signal e and reference microphone signal ref, to yield GL=EL/RL, where EL is the magnitude of the low-pass filtered version of error signal err produced by low-pass filter 38A and RL is the magnitude of the low-pass filtered version of reference microphone signal ref produced by low-pass filter 38B. A second ratio is computed from magnitudes of the band-pass filtered versions of error signal e and reference microphone signal ref, to yield GH=EH/RH, where EH is the magnitude of the band-pass filtered version of error signal e produced by band-pass filter 39A and RH is the magnitude of the band-pass filtered version of reference microphone signal ref produced by band-pass filter 39B. At a time when response SE(z) of adaptive filter 34A and response W(z) of adaptive filter 32 are known to be well-adapted, the values of GH and GL can be stored as $GH_0$ and $GL_0$, respectively. Subsequently, when either or both of GH and GL changes, the changes can be compared to corresponding thresholds $THR_H$, $THR_L$, respectively, to reveal the conditions of the ANC system as shown in Table 1.

TABLE 1

| $GL - GL_0 > THRES_L$ | $GH - GH_0 > THRES_H$ | Condition | Cause |
|---|---|---|---|
| False | False | W(z), SE(z) trained | — |
| False | True | W(z) needs update, SE(z) trained | P(z) has changed, S(z) has not changed |
| True | True | W(z), SE(z) both need update | S(z) has changed or chaos in system |

If only the high-frequency ANC gain has exceeded a threshold change amount, that is an indication that only response SE(z) of adaptive filter 34A needs to be updated, which reduces the time required to adapt the ANC system, and also avoids the need for a training signal to train response SE(z) of adaptive filter 34A, since adaptive filter 34A can generally only be adapted when source audio d of sufficient magnitude is available, or otherwise when a training signal can be injected without causing disruption audible to the listener.

Figure 6:
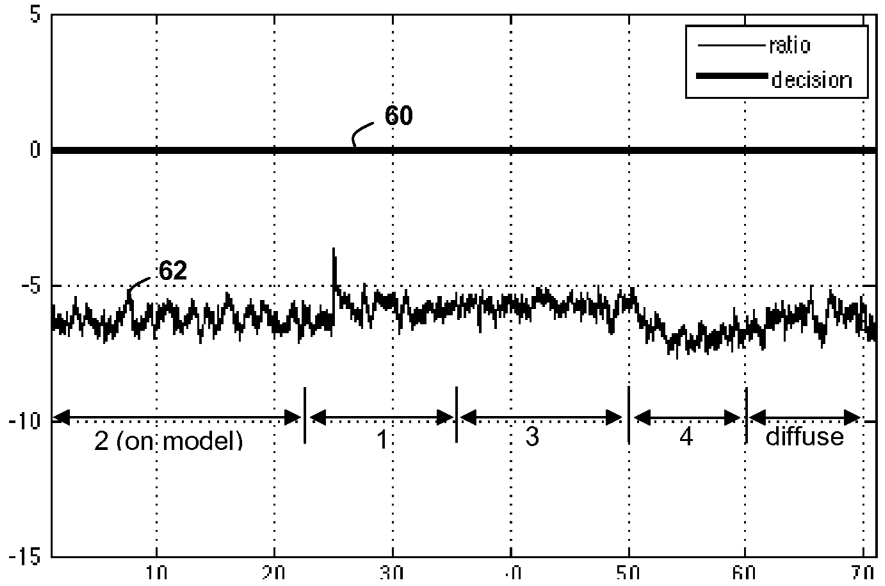
FIGS. 6-9 are waveform diagrams illustrating ANC gain and a decision based on ANC gain for various conditions and environments of wireless telephone 10.
Figure 7:
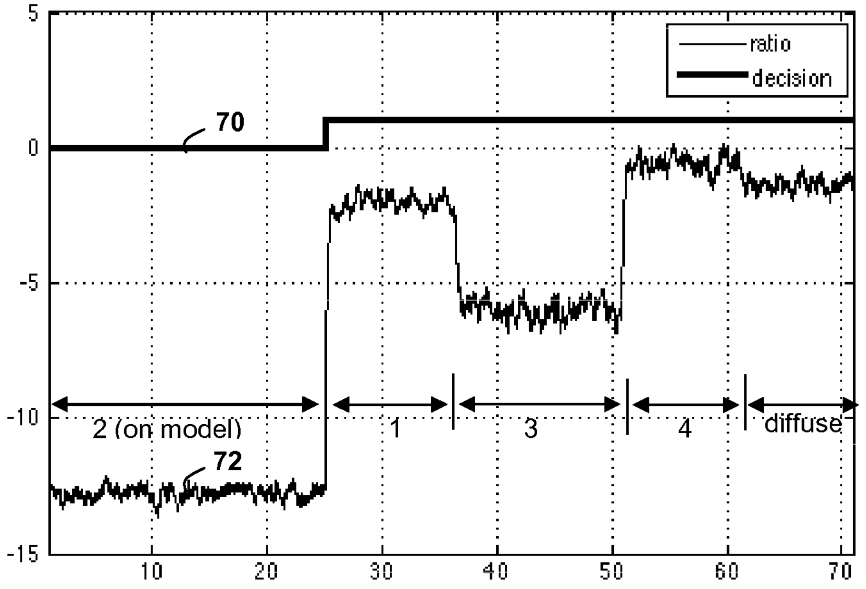
Figure 8:
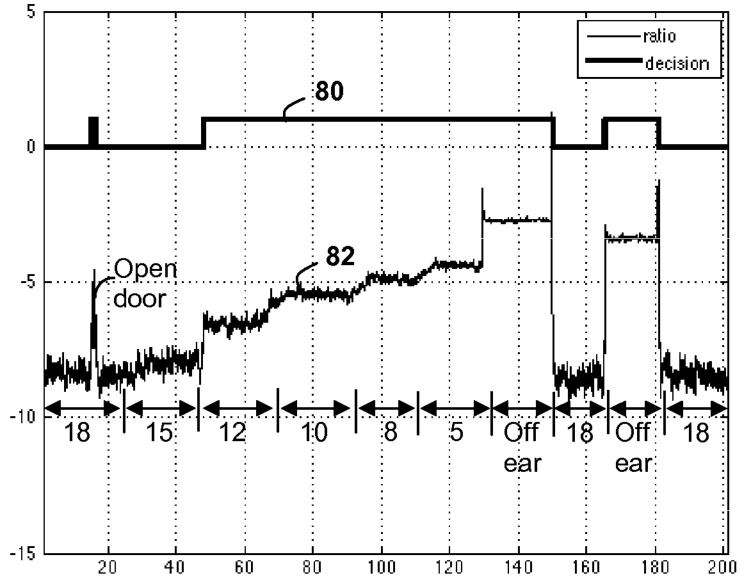
Figure 9:
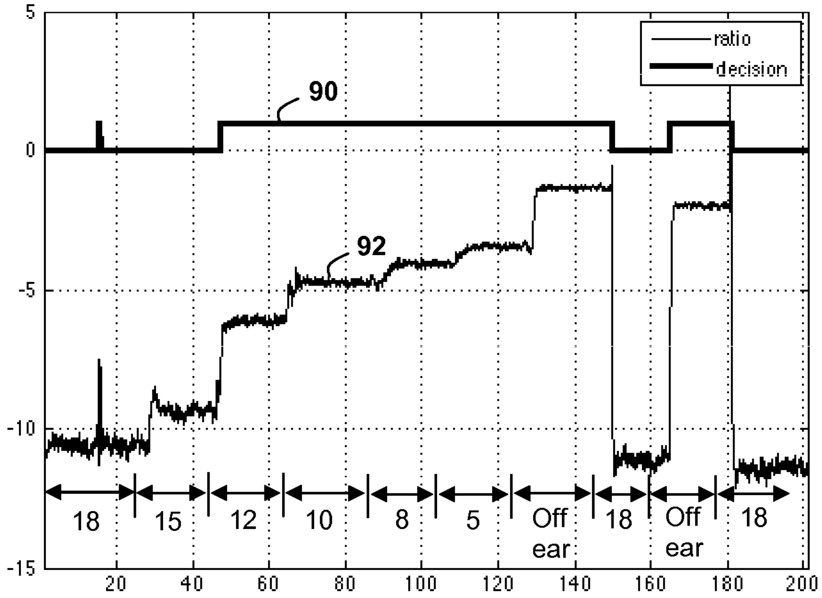

FIGS. 6-9 illustrate operation of an ANC system using an oversight algorithm as described above, under various operating conditions. FIGS. 6-7 illustrate the response of the system when a source of background noise changes, i.e., when the response of path P(z) changes and response W(z) is required to re-adapt in order to accommodate the change. FIG. 6 shows the value of GL 62 and a value of the corresponding binary decision 60 illustrated in Table 1 (no change). FIG. 7 shows the value of GH 72 and a value of the corresponding binary decision 70 illustrated in Table 1 (change will be used to trigger update of adaptive filter 32). The interval values on the graphs in FIGS. 6-7 (e.g., 2, 1, 3, 4 and Diffuse) show different corresponding test locations of a noise source, with the last interval being diffuse acoustic noise. Initially, with the noise source at location 2, the ANC system is on-model, with adaptive filter 32 adapted to cancel the ambient noise provided through acoustic path P(z) and adaptive filter 34A accurately modeling acoustic path S(z). Once the location of the noise source changes, acoustic path P(z) changes, but as seen in curve 62 of FIG. 6, there is no change in the low-frequency anti-noise gain GL. As seen in curve 72 of FIG. 7, high-frequency anti-noise gain GH has changed, which can be used to alter adaptation of adaptive filter 32 if needed. FIG. 8 shows the value of GL 82 and a value of the corresponding binary decision 80 illustrated in Table 1 for successive reductions in ear pressure in Newtons (N) as shown by the interval values on the graph (e.g., 18N, 15N . . . 5N, and off-ear), with the decision used to trigger update of adaptive filter 34A changing state between 15N and 12N. FIG. 9 shows the value of GH 92 and a value of the corresponding binary decision 90. As seen in FIGS. 8-9, when acoustic path S(z) changes (due to the change in ear pressure), both GL and GH change, allowing the ANC system to determine that secondary path response SE(z) of adaptive filter 34A needs to be adapted.

In response to detecting the off-model condition/poor ANC gain conditions above, several remedial actions can be taken by control block 39 of FIG. 3A. ANC gain should be present for frequencies below 500 Hz as shown in FIG. 5. If the ANC gain is low, then the gain of response W(z) can be reduced by control block 39 adjusting a control value gain supplied to W coefficient control 31. Control value gain can be iteratively adjusted until the ANC gain value approaches 0 dB (unity). If the ANC gain value is good, the coefficients of response W(z) can be saved as a value for providing a fixed portion of response W(z) in a parallel filter configuration where only a portion of response W(z) is adaptive, or the coefficients can be saved as a starting point when response W(z) needs to be reset. If there is no ANC gain (ANC gain≈0) then the gain of response W(z) (coefficient $w_1$) can be increased and the ANC gain re-measured. If boost occurs, then the gain of response W(z) (coefficient $w_1$) can be decreased and the ANC gain re-measured. If the ANC gain is bad, then response W(z) can be commanded to re-adapt for a short period after saving the current value of the coefficients of response W(z). If ANC gain improves, the process can be continued; otherwise a previously stored value of response W(z) or known good value for response $W_{FIXED}$ can be applied for the coefficients for a time period until the ANC gain can be re-evaluated and the process repeated.

Figure 3B:
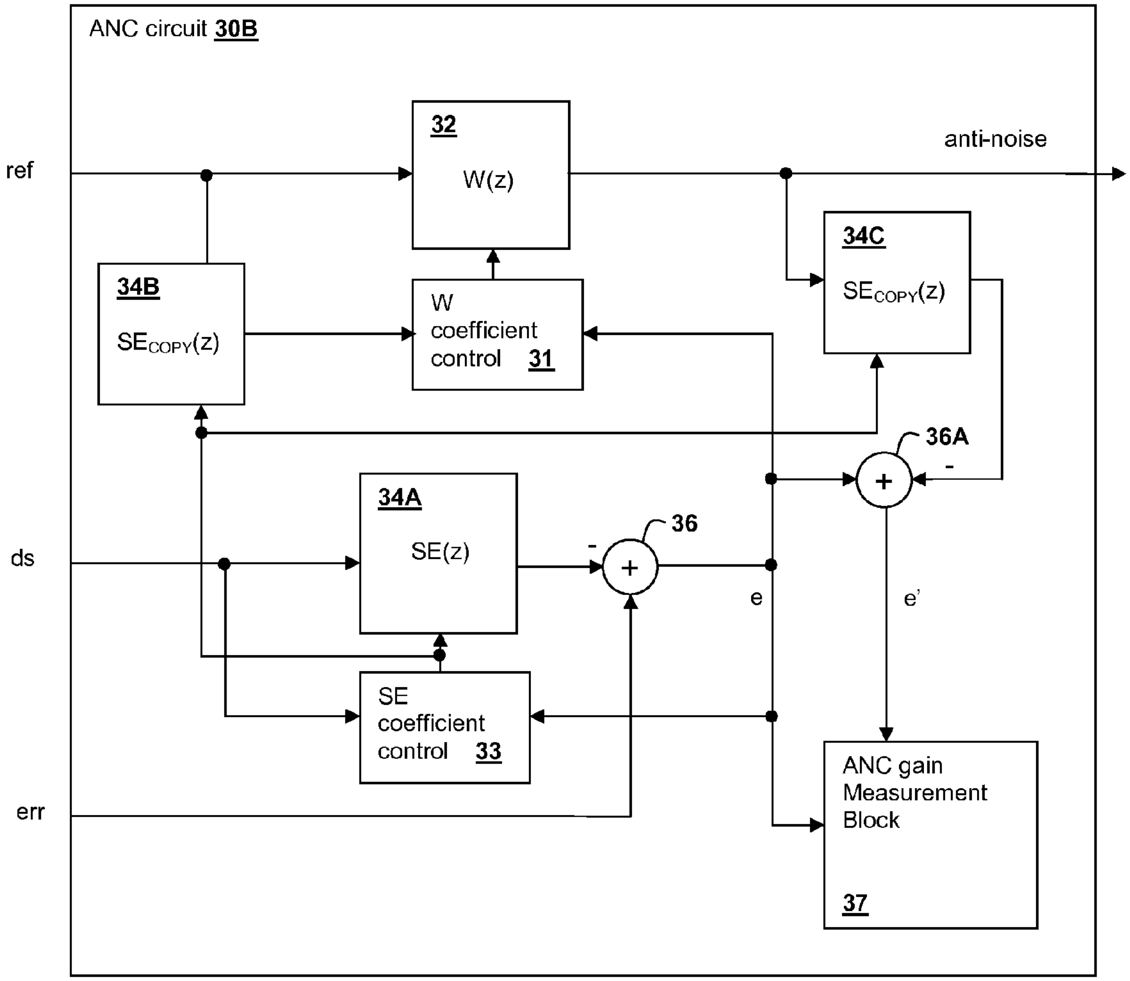

Now referring to FIG. 3B, an ANC circuit 30B is similar to ANC circuit 30A of FIG. 3A, so only differences between them will be described below. ANC circuit 30B includes another filter 34C that has a response equal to the secondary path estimate copy $SE_{COPY}(z)$, which is used to transform anti-noise signal anti-noise to a signal that represents the anti-noise expected in error microphone signal err, a combiner 36A subtracts the output of filter 34C to obtain modified error signal e', which is an estimate of what error signal e would be if anti-noise signal anti-noise was muted, i.e., R(z)*P(z). ANC gain measurement block 37 can then compare, which may by cross-correlation or comparing amplitudes, error signal e and modified error signal e' to obtain ANC gain from the magnitude of e/e', which is a real-time indication of the contributions of the anti-noise signal to error signal e over the operational frequency band of ANC circuit 30B.

Figure 4:
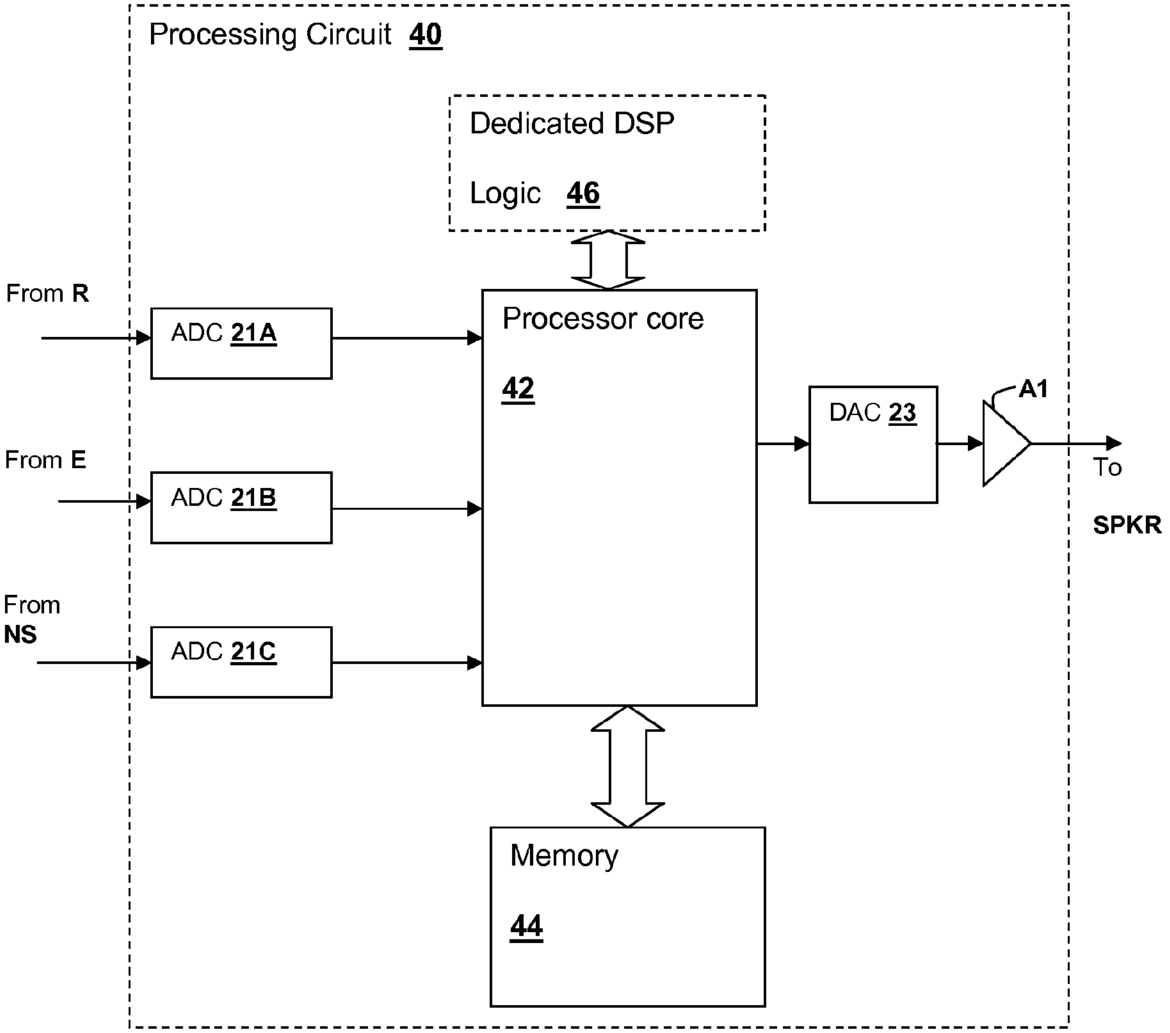
FIG. 4 is a block diagram depicting signal processing circuits and functional blocks within CODEC integrated circuit 20.

Referring now to FIG. 4, a block diagram of an ANC system is shown for implementing ANC techniques as depicted in FIG. 3, and having a processing circuit 40 as may be implemented within CODEC integrated circuit 20 of FIG. 2. Processing circuit 40 includes a processor core 42 coupled to a memory 44 in which are stored program instructions comprising a computer-program product that may implement some or all of the above-described ANC techniques, as well as other signal processing. Optionally, a dedicated digital signal processing (DSP) logic 46 may be provided to implement a portion of, or alternatively all of, the ANC signal processing provided by processing circuit 40. Processing circuit 40 also includes ADCs 21A-21C, for receiving inputs from reference microphone R, error microphone E and near speech microphone NS, respectively. In alternative embodiments in which one or more of reference microphone R, error microphone E and near speech microphone NS have digital outputs, the corresponding ones of ADCs 21A-21C are omitted and the digital microphone signal(s) are interfaced directly to processing circuit 40. DAC 23 and amplifier A1 are also provided by processing circuit 40 for providing the speaker output signal, including anti-noise as described above. The speaker output signal may be a digital output signal for provision to a module that reproduces the digital output signal acoustically.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A personal audio device, comprising:

a personal audio device housing;

a transducer mounted on the housing for reproducing an audio signal including both source audio for playback to a listener and an anti-noise signal for countering effects of ambient audio sounds in an acoustic output of the transducer;

a reference microphone mounted on the housing for providing a reference microphone signal indicative of the ambient audio sounds;

an error microphone mounted on the housing in proximity to the transducer for providing an error microphone signal indicative of the acoustic output of the transducer and the ambient audio sounds at the transducer; and a processing circuit that adaptively generates the anti-noise signal from the reference signal by adapting a first adaptive filter to reduce the presence of the ambient audio sounds heard by the listener in conformity with an error signal and the reference microphone signal, wherein the processing circuit implements a secondary path adaptive filter having a secondary path response that shapes the source audio and a combiner that removes the source audio from the error microphone signal to provide the error signal, wherein the processing circuit computes a ratio of a first indication of a magnitude of the error microphone signal including effects of the anti-noise signal to a second indication of the magnitude of the error microphone signal not including the effects of the anti-noise signal to determine an adaptive noise canceling gain, wherein the processing circuit compares the adaptive noise cancelling gain to a threshold gain value, wherein the processing circuit takes action on the anti-noise signal in response to determining that the adaptive noise canceling gain is greater than the threshold gain value, wherein the processing circuit filters the error signal with a first low-pass filter to generate the first indication of the magnitude of the error microphone signal, and wherein the processing circuit filters the reference microphone signal with a second low-pass filter to generate the second indication of the magnitude of the error microphone signal.

2. The personal audio device of claim 1, wherein the processing circuit uses a magnitude of the reference microphone signal as the second indication of the magnitude of the error microphone signal.

3. The personal audio device of claim 1, wherein the processing circuit applies a copy of the secondary path response to the anti-noise signal to generate a modified anti-noise signal and combines the modified anti-noise signal with the error microphone signal to generate the second indication of the magnitude of the reference microphone signal.

4. The personal audio device of claim 1, wherein the processing circuit computes the ratio as a first ratio of the first indication of the magnitude of the error microphone signal to the second indication of the magnitude of the error microphone signal to determine the adaptive noise canceling gain as a first adaptive noise canceling gain for a low-frequency range, and wherein the processing circuit computes a second ratio for a higher-frequency range than a frequency range of the first and second low-pass filters, wherein the processing circuit computes the second ratio from a third indication of the magnitude of the error signal in the higher-frequency range including effects of the anti-noise signal, to a fourth indication of the magnitude of the error microphone signal in the higher-frequency range not including the effects of the anti-noise signal, and wherein the processing circuit compares the first ratio to the second ratio to select an action to take on the anti-noise signal, if at least one of the first ratio or the second ratio is greater than the threshold gain value.

5. The personal audio device of claim 4, wherein the processing circuit detects changes in the first ratio and the second ratio, and wherein the processing circuit, responsive to detecting a comparable change in both the first ratio and the second ratio, takes action to correct the secondary path response, and wherein the processing circuit responsive to detecting a substantial change in only the second ratio, takes action to correct a response of the first adaptive filter.

6. The personal audio device of claim 5, wherein the processing circuit enables adaptation of the first adaptive filter if the processing circuit detects the substantial change in only the second ratio, and disables adaptation of the first adaptive filter if the processing circuit detects the comparable change in both the first ratio and the second ratio.

7. The personal audio device of claim 1, wherein the processing circuit takes action by reducing a gain of the first adaptive filter.

8. The personal audio device of claim 1, wherein the processing circuit takes action in response to detecting that the adaptive noise canceling gain is less than a lower threshold value by increasing a gain of the first adaptive filter and re-measuring the adaptive noise canceling gain, wherein the increasing of the gain of the first adaptive filter is repeated while the adaptive noise canceling gain is less than the lower threshold value.

9. The personal audio device of claim 1, wherein the processing circuit takes action in response to detecting that the adaptive noise canceling gain is greater than the threshold gain value by storing a set of values of coefficients of the first adaptive filter, and takes action in response to detecting that the adaptive noise canceling gain is less than a lower threshold value by restoring the stored set of values of the coefficients of the first adaptive filter.

10. The personal audio device of claim 9, wherein the processing circuit further stores another set of values of coefficients of the secondary path adaptive filter in response to detecting that the adaptive noise canceling gain is greater than the threshold gain value, and further restores the other stored set of values of the coefficients of the secondary path adaptive filter in response to detecting that the adaptive noise canceling gain is less than the lower threshold value.

11. A method of countering effects of ambient audio sounds by a personal audio device, the method comprising:

adaptively generating an anti-noise signal from the reference microphone signal by adapting a first adaptive filter to reduce the presence of the ambient audio sounds heard by the listener in conformity with an error signal and a reference microphone signal;

combining the anti-noise signal with source audio;

providing a result of the combining to a transducer;

measuring the ambient audio sounds with a reference microphone;

measuring an acoustic output of the transducer and the ambient audio sounds with an error microphone;

implementing a secondary path adaptive filter having a secondary path response that shapes the source audio and a combiner that removes the source audio from the error microphone signal to provide the error signal;

filtering the error signal with a first low-pass filter to generate the first indication of the magnitude of the error microphone signal;

filtering the reference microphone signal with a second low-pass filter to generate the second indication of the magnitude of the error microphone signal;

computing a ratio of a first indication of a magnitude of the error microphone signal including effects of the anti-noise signal to a second indication of the magnitude of the error microphone signal not including the effects of the anti-noise signal to determine an adaptive noise canceling gain;

comparing the adaptive noise cancelling gain to a threshold gain value; and taking action on the anti-noise signal in response to determining that the adaptive noise canceling gain is greater than the threshold gain value.

12. The method of claim 11, wherein the computing a ratio computes the ratio using a magnitude of the reference microphone signal as the second indication of the magnitude of the error microphone signal.

13. The method of claim 11, further comprising:

applying a copy of the secondary path response to the anti-noise signal to generate a modified anti-noise signal; and combining the modified anti-noise signal with the error microphone signal to generate the second indication of the magnitude of the reference microphone signal.

14. The method of claim 11, wherein the computing computes the ratio as a first ratio of the first indication of the magnitude of the error microphone signal to the second indication of the magnitude of the error microphone signal to determine the adaptive noise canceling gain as a first adaptive noise canceling gain for a low-frequency range, and computing a second ratio for a higher-frequency range than a frequency range of the first and second low-pass filters, wherein the computing computes the second ratio from a third indication of the magnitude of the error signal in the higher-frequency range including effects of the anti-noise signal, to a fourth indication of the magnitude of the error microphone signal in the higher-frequency range not including the effects of the anti-noise signal, and wherein the method further comprises comparing the first ratio to the second ratio to select an action to take on the anti-noise signal, if at least one of the first ratio or the second ratio is greater than the threshold gain value.

15. The method of claim 14, further comprising:

detecting changes in the first ratio and the second ratio;

responsive to detecting a comparable change in both the first ratio and the second ratio, taking action to correct the secondary path response; and responsive to detecting a substantial change in only the second ratio, taking action to correct a response of the first adaptive filter.

16. The method of claim 15, wherein the taking action comprises:

enabling adaptation of the first adaptive filter if the detecting detects the substantial change in only the second ratio; and disabling adaptation of the first adaptive filter if the processing circuit detects the comparable change in both the first ratio and the second ratio.

17. The method of claim 11, wherein the taking action comprises reducing a gain of the first adaptive filter.

18. The method of claim 11, wherein the taking action comprises:

in response to detecting that the adaptive noise canceling gain is less than a lower threshold value, increasing a gain of the first adaptive filter and re-measuring the adaptive noise canceling gain; and repeatedly increasing the gain of the first adaptive while the adaptive noise canceling gain is less than the lower threshold value.

19. The method of claim 11, wherein the taking action comprises:

in response to detecting that the adaptive noise canceling gain is greater than the threshold gain value, storing a set of values of coefficients of the first adaptive filter; and in response to detecting that the adaptive noise canceling gain is less than a lower threshold value, restoring the stored set of values of the coefficients of the first adaptive filter.

20. The method of claim 19, further comprising:

in response to detecting that the adaptive noise canceling gain is greater than the threshold gain value, storing another set of values of coefficients of the secondary path adaptive filter; and in response to detecting that the adaptive noise canceling gain is less than the lower threshold value, further restoring the other stored set of values of the coefficients of the secondary path adaptive filter.

21. An integrated circuit for implementing at least a portion of a personal audio device, comprising:

an output for providing an output signal to an output transducer including both source audio for playback to a listener and an anti-noise signal for countering the effects of ambient audio sounds in an acoustic output of the transducer;

a reference microphone input for receiving a reference microphone signal indicative of the ambient audio sounds;

an error microphone input for receiving an error microphone signal indicative of the acoustic output of the transducer and the ambient audio sounds at the transducer; and a processing circuit that adaptively generates the anti-noise signal from the reference signal by adapting a first adaptive filter to reduce the presence of the ambient audio sounds heard by the listener in conformity with an error signal and the reference microphone signal, wherein the processing circuit implements a secondary path adaptive filter having a secondary path response that shapes the source audio and a combiner that removes the source audio from the error microphone signal to provide the error signal, wherein the processing circuit computes a ratio of a first indication of a magnitude of the error microphone signal including effects of the anti-noise signal to a second indication of the magnitude of the error microphone signal not including the effects of the anti-noise signal to determine an adaptive noise canceling gain, wherein the processing circuit compares the adaptive noise cancelling gain to a threshold gain value, wherein the processing circuit takes action on the anti-noise signal in response to determining that the adaptive noise canceling gain is greater than the threshold gain value, wherein the processing circuit filters the error signal with a first low-pass filter to generate the first indication of the magnitude of the error microphone signal, and wherein the processing circuit filters the reference microphone signal with a second low-pass filter to generate the second indication of the magnitude of the error microphone signal.

22. The integrated circuit of claim 21, wherein the processing circuit uses a magnitude of the reference microphone signal as the second indication of the magnitude of the error microphone signal.

23. The integrated circuit of claim 21, wherein the processing circuit applies a copy of the secondary path response to the anti-noise signal to generate a modified anti-noise signal and combines the modified anti-noise signal with the error microphone signal to generate the second indication of the magnitude of the reference microphone signal.

24. The integrated circuit of claim 21, wherein the processing circuit computes the ratio as a first ratio of the first indication of the magnitude of the error microphone signal to the second indication of the magnitude of the error microphone signal to determine the adaptive noise canceling gain as a first adaptive noise canceling gain for a low-frequency range, and wherein the processing circuit computes a second ratio for a higher-frequency range than a frequency range of the first and second low-pass filters, wherein the processing circuit computes the second ratio from a third indication of the magnitude of the error signal in the higher-frequency range including effects of the anti-noise signal, to a fourth indication of the magnitude of the error microphone signal in the higher-frequency range not including the effects of the anti-noise signal, and wherein the processing circuit compares the first ratio to the second ratio to select an action to take on the anti-noise signal, if at least one of the first ratio or the second ratio are greater than the threshold gain value.

25. The integrated circuit of claim 24, wherein the processing circuit detects changes in the first ratio and the second ratio, and wherein the processing circuit, responsive to detecting a comparable change in both the first ratio and the second ratio, takes action to correct the secondary path response, and wherein the processing circuit responsive to detecting a substantial change in only the second ratio, takes action to correct a response of the first adaptive filter.

26. The integrated circuit of claim 25, wherein the processing circuit enables adaptation of the first adaptive filter if the processing circuit detects the substantial change in only the second ratio, and disables adaptation of the first adaptive filter if the processing circuit detects the comparable change in both the first ratio and the second ratio.

27. The integrated circuit of claim 21, wherein the processing circuit takes action by reducing a gain of the first adaptive filter.

28. The integrated circuit of claim 21, wherein the processing circuit takes action in response to detecting that the adaptive noise canceling gain is less than a lower threshold value by increasing a gain of the first adaptive filter and re-measuring the adaptive noise canceling gain, wherein the increasing of the gain of the first adaptive filter is repeated while the adaptive noise canceling gain is less than the lower threshold value.

29. The integrated circuit of claim 21, wherein the processing circuit takes action in response to detecting that the adaptive noise canceling gain is greater than the threshold gain value by storing a set of values of coefficients of the first adaptive filter, and takes action in response to detecting that the adaptive noise canceling gain is less than a lower threshold value by restoring the stored set of values of the coefficients of the first adaptive filter.

30. The integrated circuit of claim 29, wherein the processing circuit further stores another set of values of coefficients of the secondary path adaptive filter in response to detecting that the adaptive noise canceling gain is greater than the threshold gain value, and further restores the other stored set of values of the coefficients of the secondary path adaptive filter in response to detecting that the adaptive noise canceling gain is less than the lower threshold value.

* * * * *